(12) United States Patent
Straeussnigg et al.

(10) Patent No.: US 7,928,867 B2
(45) Date of Patent: Apr. 19, 2011

(54) ANALOG TO DIGITAL CONVERTER WITH DIGITAL FILTER

(75) Inventors: Dietmar Straeussnigg, Villach (AT); Andreas Wiesbauer, Portschach (AT)

(73) Assignee: Infineon Technologies AG, Neubiberg (DE)

(*) Notice: Subject to any disclaimer, the term of this patent is extended or adjusted under 35 U.S.C. 154(b) by 47 days.

(21) Appl. No.: 12/551,337

(22) Filed: Aug. 31, 2009

(65) Prior Publication Data

US 2011/0050475 A1 Mar. 3, 2011

(51) Int. Cl.
*H03M 3/00* (2006.01)
(52) U.S. Cl. .......................... 341/77; 341/143
(58) Field of Classification Search .............. 341/76, 341/77, 143, 155
See application file for complete search history.

(56) References Cited

U.S. PATENT DOCUMENTS

| | | | | | |
|---|---|---|---|---|---|
| 3,843,940 | A | * | 10/1974 | Ishiguro et al. | 375/245 |
| 5,124,703 | A | * | 6/1992 | Kaneaki et al. | 341/77 |
| 5,493,296 | A | * | 2/1996 | Sugihara | 341/76 |
| 5,682,161 | A | * | 10/1997 | Ribner et al. | 341/143 |
| 6,404,368 | B1 | * | 6/2002 | Yamaguchi | 341/143 |
| 6,570,512 | B1 | * | 5/2003 | Hauptmann et al. | 341/77 |
| 2002/0175846 | A1 | * | 11/2002 | Sakimura | 341/143 |
| 2007/0241950 | A1 | * | 10/2007 | Petilli et al. | 341/143 |
| 2010/0079324 | A1 | * | 4/2010 | Lakdawala et al. | 341/143 |
| 2010/0283650 | A1 | * | 11/2010 | Van Veldhoven | 341/143 |

* cited by examiner

*Primary Examiner* — Howard Williams
(74) *Attorney, Agent, or Firm* — SpryIP, LLC

(57) ABSTRACT

Disclosed herein are devices, methods, and techniques including analog to digital converters having at least one digital filter.

20 Claims, 7 Drawing Sheets

ANALOG TO DIGITAL CONVERTER WITH DIGITAL FILTER

BACKGROUND

Converter circuits for converting analog signals to digital signals and vice versa are found in a wide variety of circuits and devices, including compact disc (CD) players, digital video disc (DVD) players, signal processors, and various other systems that communicate signals, such as in a wide local area network (WLAN). A disadvantage of the typical analog to digital converter circuit is the analog tracking or loop filter in the feedback path. For example, an analog implementation of the tracking or loop filter requires a considerable proportion of the overall area available (e.g. ~30% of the total area in the WLAN application). Moreover, the analog filter cannot be implemented aggressively to provide a high performance analog to digital circuit.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are improved techniques for including a digital filter in an analog to digital converter circuit having a feedback component. Moreover, techniques are disclosed to quantize, that is, remove one or more least significant bits from the signal output by the digital filter. This permits a more simplified feedback component. However, quantization noise may be introduced into the system. Thus, a reconstruction component is configured to provide a reconstructed signal that represents or otherwise corrects for this noise. In general, techniques in accordance with the present disclosure may advantageously reduce or eliminate quantization noise. Moreover, performance may be increased while power and surface area requirements may be reduced.

In general, implementations in accordance with the present disclosure utilize a digital filter component and quantization techniques to permit the feedback of a lower bit digital signal without sacrificing performance or accuracy. In some implementations, a decimation filter may also be incorporated to reduce the sampling rate and thus further reduce power requirements for the analog to digital circuit.

Techniques, including circuits and methods, in accordance with the present disclosure may be implemented in a number of ways. Example environment and context is provided below with reference to the included figures and for the purposes of the ongoing discussion.

Exemplary Systems

Figure 1:
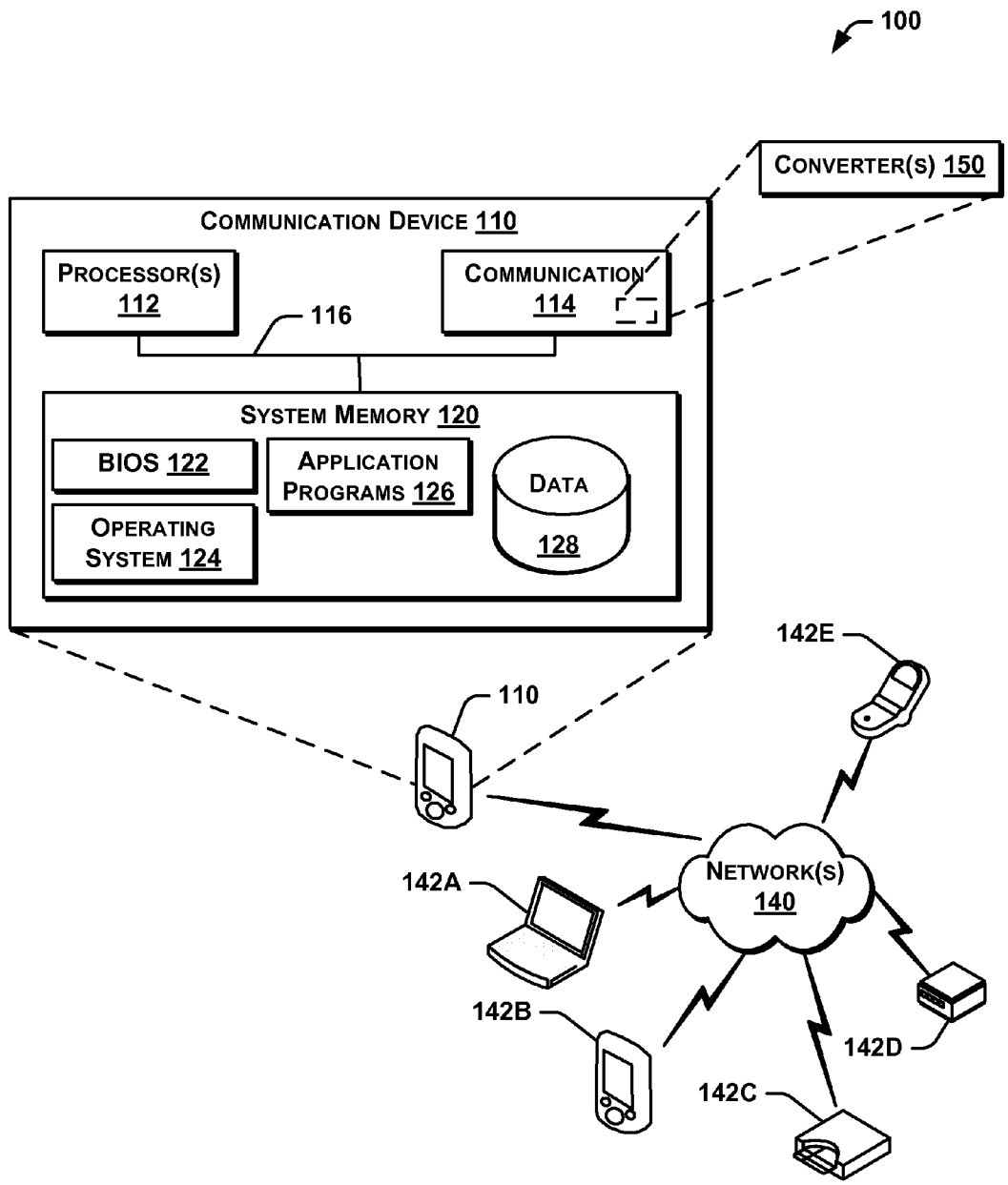
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110, or other mobile and/or electronic device, having one or more analog to digital converter circuits 150 configured in accordance with the teachings of the present disclosure. The communication device 110 operatively communicates via one or more networks 140, such as wireless local area network (WLAN), with a plurality of other devices 142. Alternatively, the communication device 110 may bypass the networks 140 and communicate directly with one or more of the other devices 142. Detailed descriptions of various aspects of analog to digital converter circuits, methods, and techniques are provided in the following sections with reference to FIGS. 2 through 7.

In the representative environment 100, the communication device 110 is a hand-held device, such as an MP3 (Moving Picture Exerts Group Layer-3) player, a personal data assistant (PDA), a global positioning system (GPS) unit, mobile telephone, smartphone, or other similar hand-held device, and the other devices 142 may include, for example, a computer 142A, another hand-held device 142B, a compact disc (CD) or digital video disc (DVD) player 142C, a signal processor 142D (e.g., radio, navigational unit, television, etc.), and a mobile phone 142E. In alternative implementations, of course, the devices 110, 142 may include any other suitable devices, and it is understood that any of the plurality of devices 142 may be equipped with analog to digital converter circuits 150 that operate in accordance with the teachings of the present disclosure.

As further shown in FIG. 1, the communication device 110 includes one or more processors 112 and one or more communication components 114, such as input/output (I/O) devices (e.g., transceivers, transmitters, receivers, etc.), coupled to a system memory 120 by a bus 116. In the implementation shown in FIG. 1, the analog to digital converter circuit 150 is included as a component within the communication component 114 of the communication device 110. In alternative implementations, however, the analog to digital converter circuit 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The communication component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the analog to digital converter circuit 150 in accordance with present disclosure. Similarly, the device 110 is simply one non-limiting example of a suitable device that may include analog to digital converter circuits 150 in accordance with the present disclosure.

Analog to Digital Converter Circuits

Structural and operational aspects of implementations of analog to digital converter circuits in accordance with the present disclosure will now be described. For example, an analog to digital converter circuit 150 in accordance with an implementation of the present disclosure is shown in FIG. 2.

Figure 2:
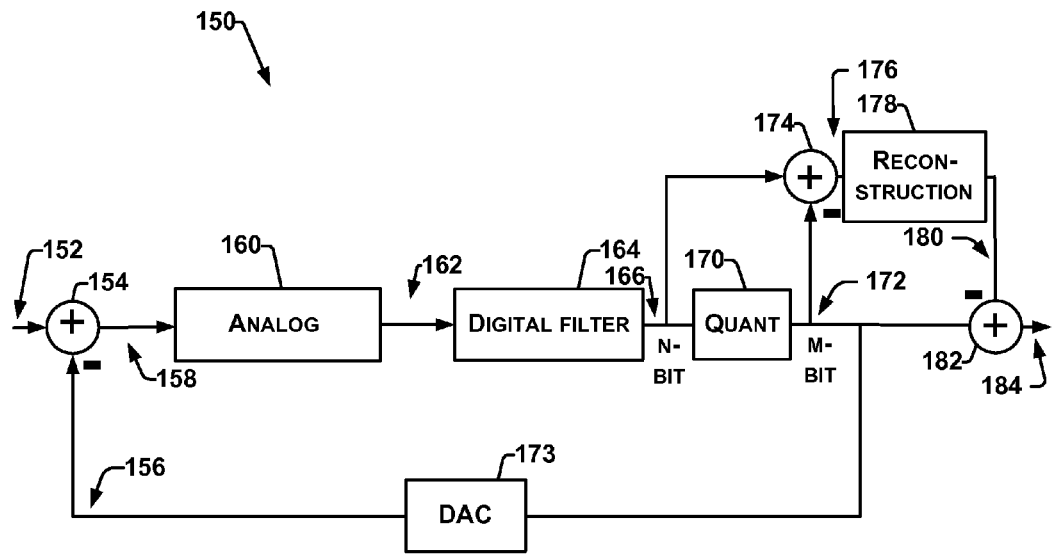
FIG. 2 is an exemplary analog to digital converter circuit in accordance with an implementation of the disclosure.

FIG. 2 shows an analog to digital converter circuit 350 for receiving an analog signal 152. The analog to digital converter circuit 350 includes a first combiner 154 for combining the analog signal 152 with a feedback analog signal 156 to provide an analog input signal 158. An analog filter component 160 is configured to receive the analog input signal 158 and provide a digital signal 162. The analog filter component 160 may include an analog filter, an analog to digital converter, sample/quantization components, pulse width modulation (PWM) components and/or other features, as will be discussed in further detail below. A digital filter component 164, such as a low pass filter, is configured to filter the digital signal 162 and provide a filtered digital signal 166, which may have n-bits. A quantization component 170 is configured to quantize the filtered digital signal and provide a quantized signal 172, which may have m-bits, where m is less than n. A feedback component, such as digital to analog converter 173, is configured to convert the quantized digital signal 172 into the feedback analog signal 156. The quantized signal 172 is also combined with the filtered digital signal 166 at a second combiner 174 to provide quantization error signal 176 to a reconstruction component 178. The reconstruction component 178 may be a finite impulse response (FIR) filter, infinite impulse response (IRR) filter, or other suitable filter, device, hardware, and/or software component configured to simulate a noise transfer function and provide a reconstructed signal 180. A third combiner 182 may be configured to combine the reconstructed signal 180 with the quantized digital signal 172 and, thus, provide an output signal 184 of the analog to digital converter circuit 350.

Figure 3:
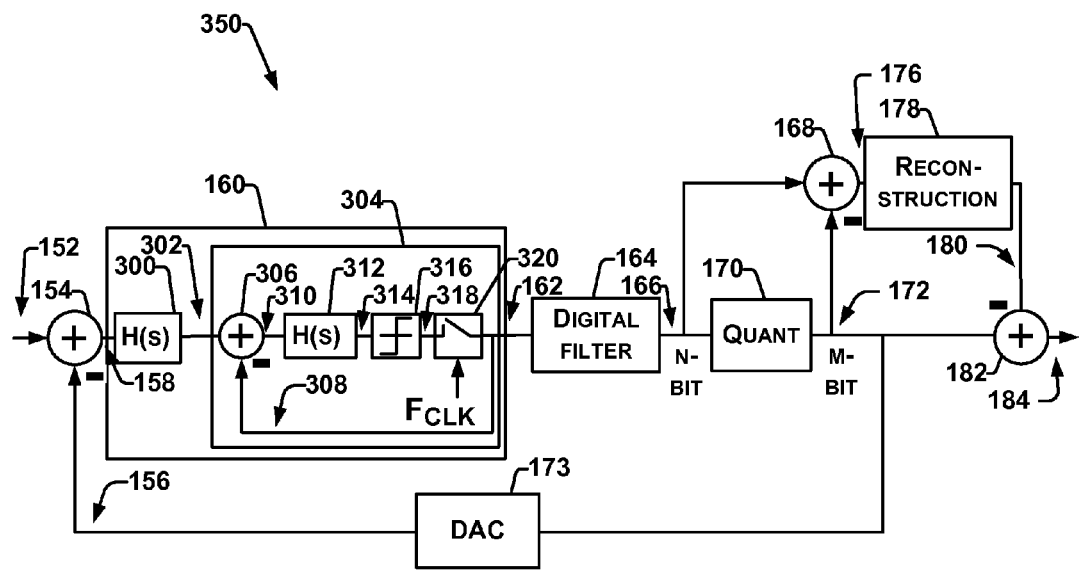
FIG. 3 is an exemplary pulse width modulation (PWM) based analog to digital converter circuit in accordance with an implementation of the disclosure.

FIG. 3 shows an implementation of the analog to digital converter circuit 350, which may be similar to analog to digital converter circuit 150 as demonstrated using common reference numerals, in which the analog filter component 160 includes a filter and a pulse width modulation (PWM) circuit. More specifically, an analog signal 152 arrives at a first combiner (or combining component) 154, which combines a feedback signal 156 with the analog signal 152. In some embodiments, the first combiner 154 may be a summing (or differencing) component which adds (or subtracts) the feedback signal 156 from the analog signal 152. In other embodiments, the first combiner 154 may combine these signals in other desired ways. A resulting combined analog input signal 158 from the first combiner 154 is provided to an analog filter component 160.

The analog filter component 160 may have an analog filter 300 in which the design is described by a complex transfer function H(s) in the Laplace plane. The analog filter 300 may be a loop filter or any other suitable signal-shaping component. The analog filter 300 may filter the analog input signal 158 to provide a filtered analog signal 302. The filtered analog signal 302 from the analog filter 300 is received by a PWM component 304. The filtered analog signal 302 may be combined at a second combiner (or combining component) 306 with a feedback signal 308. In one alternative implementation, the analog filter 300 may be omitted, in which event the combined analog input signal 158 may be combined with the feedback signal 308. In some embodiments, the second combiner 306 may be a summing (or differencing) component which adds (or subtracts) the feedback signal 308 to (of from) the filtered analog signal 302. In other embodiments, the second combiner 306 may combine these signals in other desired ways. A resulting signal 310 from the second combiner 306 is provided to a filter 312, which may have a design described by a complex transfer function H(s) in the Laplace plane. The filter 312 may be a low pass filter, or any other suitable signal-shaping component. A resulting filtered signal 314 from the filter 312 is provided to a comparator 316.

The comparator 316 (or other suitable analyzer) provides a comparator output 318 based on the filtered signal 314. The comparator output 318 is received by a sampling component 320. The sampling component 320 performs a time discretization on the comparator output 318 based on a sampling frequency $f_{CLK}$ to provide a digitized signal 162. The digitized signal 162 may also be fed back to provide the feedback signal 308 to the second combiner 306.

As further shown in FIG. 3, the digitized signal 162 output by PWM component 304 is provided as a pulse width modulated signal, which may be a one-bit or multi-bit signal, to a digital filter 164, such as a digital tracking filter. The digital filter 164 may provide a multi-bit (n-bit) signal 166 to a third combiner (or combining component) 168 and to a quantizer 170. Utilizing a digital tracking filter in this implementation may have the advantage of eliminating the need for an analog tracking filter. Eliminating the analog tracking filter conserves circuit real estate as the analog tracking filter for converter implementations is relatively large compared to the converter. Eliminating the analog filter also allows the use of more aggressive filters in the digital converter circuits 150 and 350.

In order to be able to enable digital to analog converters (DACs), such as DAC 173 to be more efficient, the multi-bit (n-bit) signal 166 may be modified or configured to have a small word width (e.g. m-bit, where m is less than n). To accomplish this small word width, the multi-bit (n-bit) signal 166 is quantized, which, without additional measures, leads to a considerable quantization noise. To reduce or avoid any effects of this quantization noise, the quantization error is filtered and subtracted from the quantized output signal, through a process known as reconstruction. Thus, the quantizer 170 provides an m-bit signal 172, where m is an integer less than n, to the third combiner 168, which combines the n-bit multi-bit signal 166 with the m-bit signal 172. In some embodiments, the third combiner 168 may be a summing (or differencing) component which adds (or subtracts) the multi-bit (n-bit) signal 166 with the m-bit signal 172. In other embodiments, third combiner 168 may combine these signals in other desired ways. A resulting quantization error signal 176 from the third combiner 168 is provided to a reconstruction component 178, which represents a digital filter or other suitable device that simulates the noise transfer function (NTF) of the system having feedback, i.e., the analog to digital converter circuit 150.

A fourth combiner 182 receives an error correction signal 180 from the reconstruction component 178, and the m-bit signal 172 from the quantizer 170, and combines the error correction signal 180 with the m-bit signal 172 to provide a corrected output 184. The fourth combiner 182 may combine the signals by summing, differencing, or other suitable form of combination. Since the error correction signal 180 corrects for error originating from the digital filter 164 and the quantizer 170, the corrected output 184 (i.e. the output signal for the converter circuit 150) may be virtually free from potential errors generated by these components.

Figure 4:
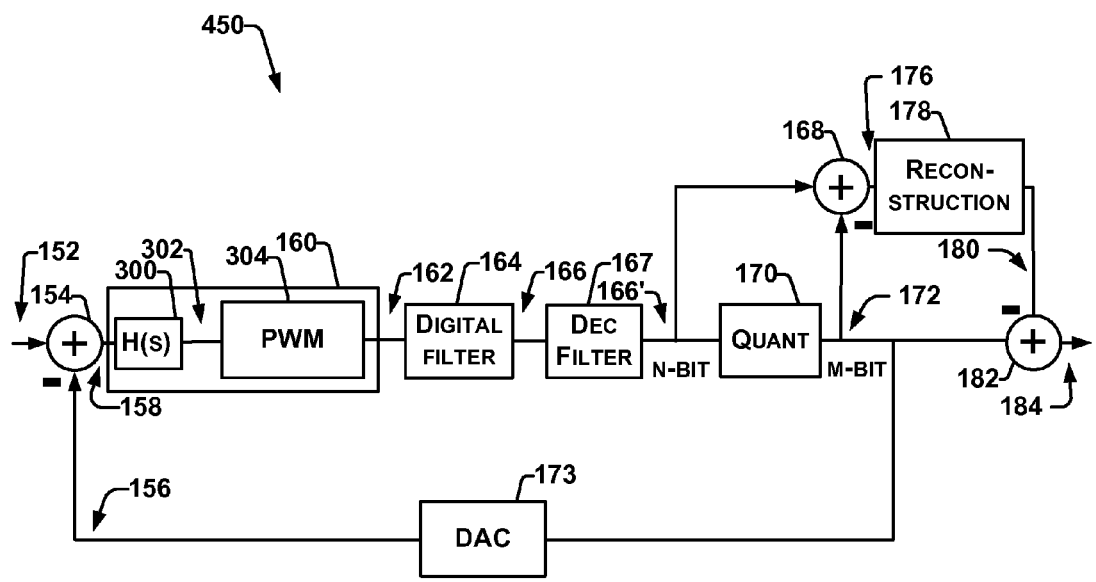
FIG. 4 is an implementation of a PWM based analog to digital converter circuit having a decimation filter.

FIG. 4 shows an alternative implementation of a converter circuit 450, which may be similar to converter circuit 150. This implementation may be generally similar to the implementations described with reference to FIGS. 2 and 3, with the exception that the converter circuit 450 shown in FIG. 4 additionally includes a decimation filter 167 between the digital filter 164 and the quantizer 170 to provide a decimated n-bit multi-bit signal 166'. The decimation filter 167 may alternatively be located between the analog filter component 160 and the digital filter 164. By locating the decimation filter 167 in front of the quantizer 170, the reconstruction component 178 and feedback component 173 may be operated at a reduced clock rate. This allows the circuit 150 to operate using less power.

The implementations shown in FIGS. 2-4 utilize a digital filter 164 as a tracking filter and, thus, avoid the use of an analog tracking filter, which conserves area. The implementation of a digital tracking filter also enables aggressive filters. Moreover, DACs, such as DAC 173, having a small word width can be used (typically 2-3 bits). Still further, the DAC and quantization error compensation can also proceed at a decimated clock rate (reduced power loss) as shown with regard to FIG. 4.

Figure 5:
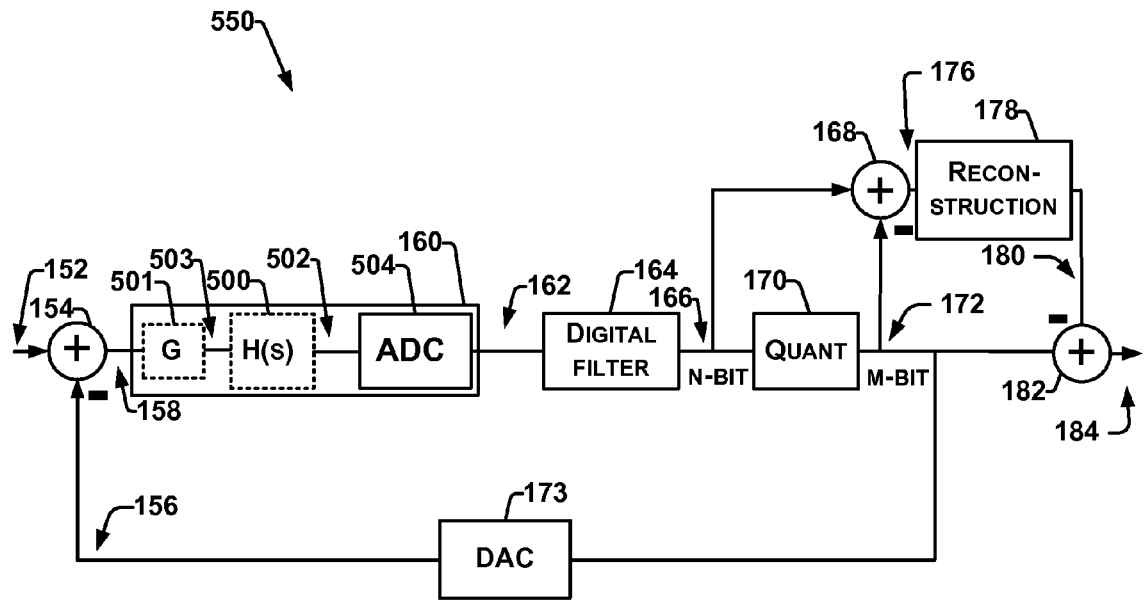
FIG. 5 is an exemplary analog to digital converter circuit in accordance with an alternative implementation of the disclosure in which the analog component includes a gain component.

It will be appreciated that the converter circuits described above with reference to FIGS. 2-4 are exemplary implementations. However, a variety of alternative implementations of converter circuit 150 may be conceived in accordance with the teachings of the present disclosure. For example, FIG. 5 shows an analog to digital converter circuit 550 in accordance with an alternative implementation of the disclosure. Many of the components of the converter circuit 550 are similar to the previously-described implementation of converter circuit 150 in FIG. 2, and for the sake of brevity, only significant differences between the converter circuit 550 and the converter circuit 150 will be described in detail. Additionally, similar features from FIG. 2 are given the same numbers in FIG. 5.

FIG. 5 shows an implementation similar to the implementation described with reference to FIG. 1 in which the converter circuit 550 includes a first combiner 154 and an analog filter component 160. A digitized signal 162 from the analog filter component 160 is received by a digital filter component 164 which, in turn, provides a filtered digital signal 166, which may have n-bits. A quantization component 170 is configured to quantize the filtered digital signal and provide a quantized signal 172, which may have m-bits, where m is less than n. A feedback component, such as digital to analog converter 173, is configured to convert the quantized digital signal 172 into the feedback analog signal 156. The quantized signal 172 is also combined with the filtered digital signal 166 at a second combiner 174 to provide quantization error signal 176 to a reconstruction component 178, which provides a reconstructed signal 180. A third combiner 182 may be configured to combine the reconstructed signal 180 with the quantized digital signal 172 to provide an output signal 184 of the analog to digital converter circuit 150.

In the implementation shown in FIG. 5, the analog filter 160 includes an analog to digital converter (ADC) 504, which may be a pulse width modulator component (similar to PWM component 304), a sampling and quantization component, or other suitable device for converting an analog signal to a digital signal. The analog filter 160 may further include an optional gain component 501 and/or an analog loop filter 500, as illustrated using dotted lines. The gain component 501 may be utilized to receive and increase the amplitude of the analog input signal 158, which may have the benefit of increasing the signal to noise ratio (SNR) and provide a gained signal 503. The analog loop filter 500 may filter and/or shape the gained signal 503 prior to converting it with the ADC 504 into the digitized signal 162. By implementing the ADC 504 as a sampling and quantization component, the converter may be operated as a sigma delta converter.

Figure 6:
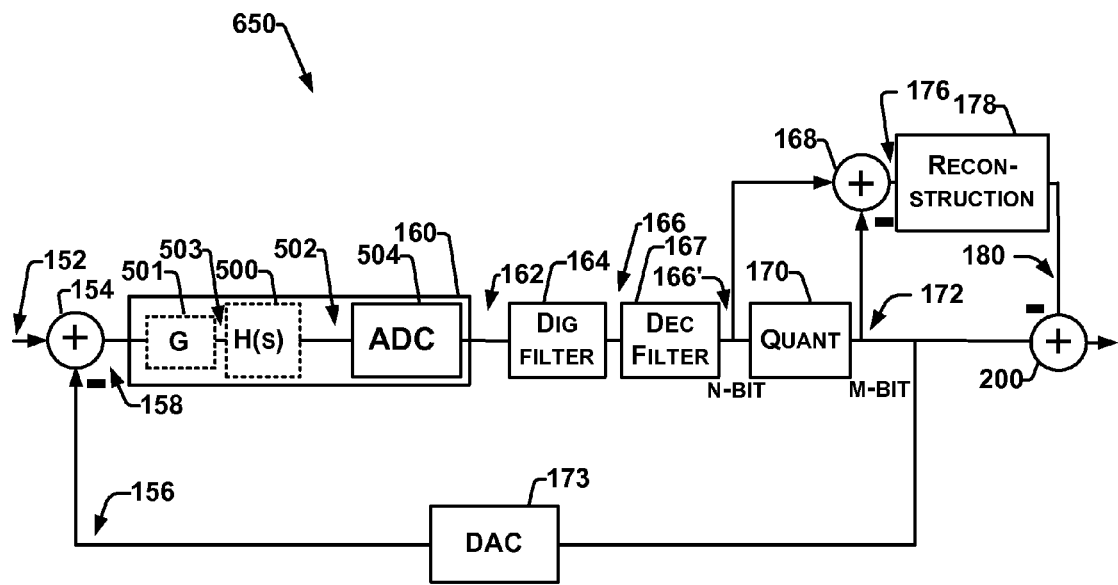
FIG. 6 is an exemplary analog to digital converter circuit in accordance with an alternative implementation of the disclosure in which the analog component includes a gain component and the analog to digital converter circuit has a decimation filter.

FIG. 6 shows an alternative implementation of converter 650, which may be similar to converter circuit 550 (as shown using common reference numerals) with the exception that the converter circuit 650 shown in FIG. 6 also includes a decimation filter 167 between the digital filter 164 and the quantizer 170 to provide a decimated n-bit multi-bit signal 166'. The decimation filter 167 may alternatively be located between the analog filter component 160 and the digital filter 164. By locating the decimation filter 167 in front of the quantizer 170, the reconstruction component 178 and feedback component 173 may be operated at a reduced clock rate. This allows the circuit 150 to operate using less power.

Again, it will be appreciated that the converter circuits 150-650 are merely exemplary implementations in accordance with the present disclosure, and that a variety of alternative implementations may be conceived. For example, alternative implementations may be conceived for other types of converters, based on the converter circuit implementations 150-650 (or combinations thereof). In further implementations, other electronic components that perform digitization may be conceived that incorporate techniques in accordance with the teachings of the present disclosure including, for example, scanning components (e.g., for digitizing photographs, videotape, text, etc.), digital audio components, or any other suitable digitization devices.

Exemplary Process

Figure 7:
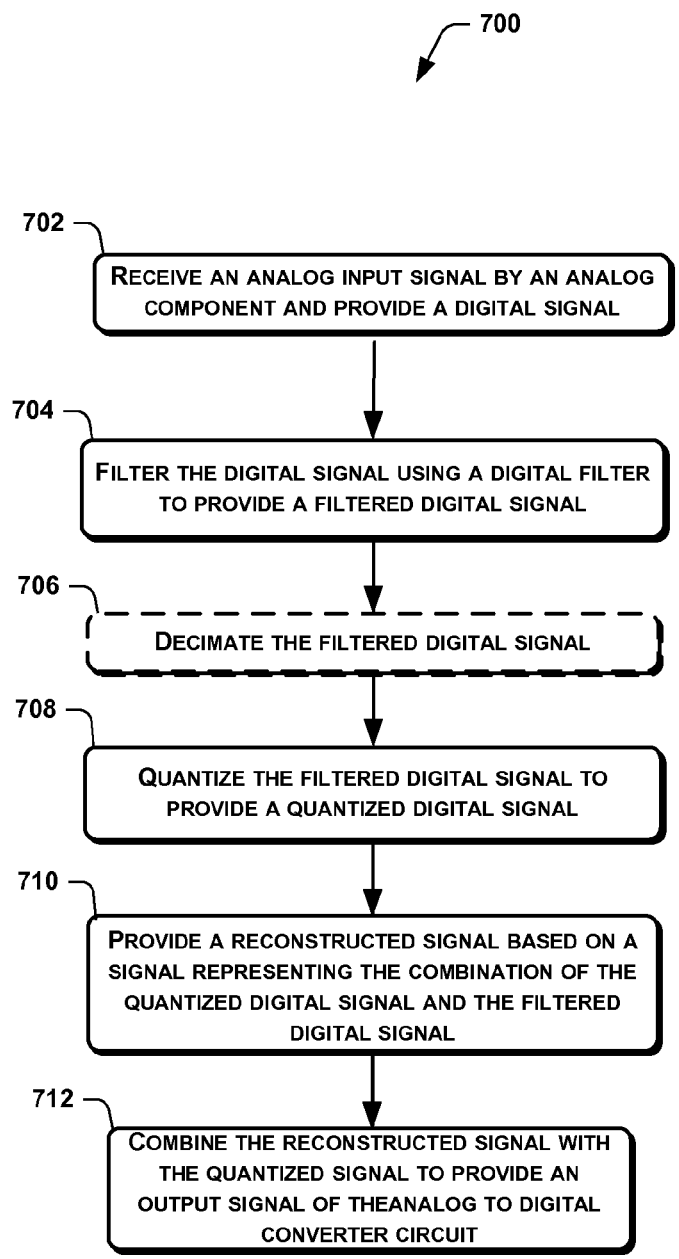
FIG. 7 is a flowchart of a process for performing an analog to digital conversion in accordance with another implementation of the present disclosure.

FIG. 7 shows an exemplary process 700 for analog to digital conversion in accordance with the present disclosure. For simplicity, the process will be described with reference to the exemplary environment 100 and the exemplary converter circuits 150-650 described above with reference to FIGS. 1-6.

At 702, an analog input signal is received by an analog component and a digital signal is provided. For example, the analog input signal may be provided by combining an analog signal 152 with a feedback analog signal 156 to provide an analog input signal 158. Analog filter component 160 may receive the analog input signal 158 and provide a digital signal 162.

According to one implementation, receiving an analog input signal by an analog component and providing a digital signal may include filtering the analog input signal to provide a filtered analog signal and converting the filtered analog signal to the digital signal. According to one implementation, the converting may be performed using a PWM circuit, such as PWM component 304, as shown with reference to FIGS. 3 and 4. According to another implementation, the converting comprises performing sampling and quantization functions for sigma-delta signal conversion as generally described with reference to FIGS. 5 and 6. According to another implementation, the gain of the analog input signal is increased prior to filtering the analog input signal, as shown with reference to FIGS. 5 and 6.

At 704, the digital signal is filtered using a digital filter to provide a filtered digital signal. For example, a digital filter component 164, which may be a low pass filter, tracking filter, loop filter, and/or other suitable digital filter component, is configured to filter the digital signal 162 and provide a filtered digital signal 166, which may have n-bits.

At 706, the filtered signal may be decimated. According to an alternative implementation, this decimation may be omitted (as shown more particularly using dashed lines) or the decimation may be performed prior to the filtering of the digital signal described with reference to block 704, above. As a result of the decimation process, components of the converter circuit, e.g. converter circuit 450, may be operated at a reduced clock rate.

At 708, the filtered digital signal is quantized to provide a quantized digital signal. For example, the quantizer 170 may provide an m-bit signal 172, where m is an integer less than n. As a result of this reduction of bits, i.e., word width reduction, components, such as DAC 173, shown as a component of the converters 150-650 may be made to operate more efficiently. To reduce or avoid any effects of this quantization noise, the quantization error is filtered and subtracted from the quantized output signal, through a process known as reconstruction.

Thus, at 710, a reconstructed signal is provided based on a signal representing the combination of the quantized digital signal and the filtered digital signal. For example, the quantized digital signal 172 may be combined with the filtered digital signal 166 (or, according certain implementations, filtered digital signal 166') at a second combiner 174 to provide quantization error signal 176 to a reconstruction component 178. The reconstruction component may be a finite impulse response (FIR) filter, infinite impulse response (IRR) filter, or other suitable filter, device, hardware, and/or software component configured to simulate a noise transfer function and provide a reconstructed signal 180. According to at least one implementation, providing the reconstructed signal may include simulating a noise transfer function of, e.g., the analog to digital converter circuit 150.

At 712, the reconstructed signal is combined with the quantized signal to provide an output signal of the analog to digital converter circuit. For example, the reconstructed signal 180 is combined with the quantized digital signal 172 to provide an output signal 184 of the analog to digital converter circuit 150, as shown with reference to FIG. 2.

It should be appreciated that the process 700 is exemplary of the teachings disclosed herein, and that the present disclosure is not limited to the particular process implementation described above and shown in FIG. 7. For example, in alternative implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

We claim:

1. An analog to digital converter circuit comprising:
   an analog component to receive an analog input signal and provide a digital signal;
   a digital filter component to filter the digital signal and provide a filtered digital signal;
   a quantization component to quantize the filtered digital signal and provide a quantized digital signal;
   a reconstruction component to provide a reconstructed signal based on a signal representing the combination of the quantized digital signal and the filtered digital signal; and
   a combiner to combine the reconstructed signal with the quantized signal to provide an output signal of the analog to digital converter system.

2. The analog to digital converter circuit according to claim 1, further comprising a decimation filter coupled between the digital filter component and the quantization component or between the analog component and the digital filter component, the decimation filter configured to reduce the sampling rate of the filtered digital signal.

3. The analog to digital converter circuit according to claim 1, wherein the analog component comprises:
   an analog loop filter configured to filter the analog input signal and provide a filtered analog signal; and
   an analog to digital converter component configured to convert the filtered analog signal to the digital signal provided by the analog component.

4. The analog to digital converter circuit according to claim 3, further comprising a decimation filter coupled between the digital filter and the quantization component or between the analog to digital converter component and the digital filter, the decimation filter configured to reduce the sampling rate of the filtered digital signal.

5. The analog to digital converter circuit according to claim 3, wherein the analog component further comprises a gain component to increase the gain of the analog input signal.

6. The analog to digital converter circuit according to claim 3, wherein the analog to digital converter component comprises a pulse width modulator circuit.

7. The analog to digital converter circuit according to claim 1, wherein the analog component comprises:
   a gain component; and
   a sampling and quantization component.

8. The analog to digital converter circuit according to claim 7, further comprising a loop filter coupled between the gain component and the sampling and quantization component.

9. The analog to digital converter circuit according to claim 7, further comprising a decimation filter coupled between the digital filter component and quantization component.

10. The analog to digital converter circuit according to claim 1, wherein the reconstruction component is configured to simulate a noise transfer function of the analog to digital converter circuit.

11. A communication device, comprising:
   a processor; and
   a communication component operatively coupled to the processor and configured to at least one of receive and transmit communication signals, the communication component including an analog to digital converter circuit comprising:
      an analog component to receive an analog input signal and provide a digital signal;
      a digital filter component to filter the digital signal and provide a filtered digital signal;
      a quantization component to quantize the filtered digital signal and provide a quantized digital signal;
      a reconstruction component to provide a reconstructed signal based on a signal representing the combination of the quantized digital signal and the filtered digital signal; and
      a combiner to combine the reconstructed signal with the quantized signal to provide an output signal of the analog to digital converter system.

12. A method of analog to digital conversion with a analog to digital converter circuit, the method comprising:
   receiving an analog input signal by an analog component and providing a digital signal;
   filtering the digital signal using a digital filter to provide a filtered digital signal;
   quantizing the filtered digital signal to provide a quantized digital signal;
   providing a reconstructed signal based on a signal representing the combination of the quantized digital signal and the filtered digital signal; and
   combining the reconstructed signal with the quantized digital signal to provide an output signal of the analog to digital converter circuit.

13. The method according to claim 12, further comprising decimating the digital signal or filtered digital signal.

14. The method according to claim 12, wherein receiving an analog input signal by an analog component and providing a digital signal comprises:
   filtering the analog input signal to provide a filtered analog signal; and
   converting the filtered analog signal to the digital signal.

15. The method according to claim 14, further comprising decimating the digital signal or the filtered digital signal.

16. The analog to digital converter circuit according to claim 14, further comprising increasing the gain of the analog input signal prior to filtering the analog input signal.

17. The method according to claim 14, wherein the converting comprises performing a pulse width modulation on the filtered analog signal.

18. The method according to claim 16, wherein the converting comprises performing sampling and quantization functions for sigma-delta signal conversion.

19. The method according to claim 18, further comprising decimating the digital signal or the filtered digital signal.

20. The method according to claim 12, wherein providing the reconstructed signal comprises simulating a noise transfer function of the analog to digital converter circuit.

* * * * *